United States Patent
Barchmann et al.

(10) Patent No.: US 9,419,193 B2
(45) Date of Patent: Aug. 16, 2016

(54) OPTOELECTRONIC COMPONENT AND METHOD FOR PRODUCING AN OPTO-ELECTRONIC COMPONENT

(75) Inventors: Bernd Barchmann, Regensburg (DE); Axel Kaltenbacher, Mintraching (DE); Norbert Stath, Regensburg (DE); Walter Wegleiter, Nittendorf (DE); Karl Weidner, München (DE); Ralph Wirth, Lappersdorf (DE)

(73) Assignees: OSRAM Opto Semiconductors GmbH, Regensburg (DE); Siemens Aktiengesellschaft, Munich (DE)

( * ) Notice: Subject to any disclaimer, the term of this patent is extended or adjusted under 35 U.S.C. 154(b) by 584 days.

(21) Appl. No.: 13/505,283

(22) PCT Filed: Oct. 5, 2010

(86) PCT No.: PCT/EP2010/064800
§ 371 (c)(1),
(2), (4) Date: Apr. 30, 2012

(87) PCT Pub. No.: WO2011/051084
PCT Pub. Date: May 5, 2011

(65) Prior Publication Data
US 2012/0223360 A1  Sep. 6, 2012

(30) Foreign Application Priority Data
Oct. 28, 2009  (DE) .......................... 10 2009 051 129

(51) Int. Cl.
*H01L 33/48* (2010.01)
*H01L 33/62* (2010.01)
(Continued)

(52) U.S. Cl.
CPC ................ *H01L 33/62* (2013.01); *H01L 24/24* (2013.01); *H01L 24/82* (2013.01); *H01L 25/0753* (2013.01); *H01L 2224/24998* (2013.01); *H01L 2224/76155* (2013.01); *H01L 2224/82102* (2013.01); *H01L 2924/014* (2013.01); *H01L 2924/01006* (2013.01); *H01L 2924/01023* (2013.01); *H01L 2924/01029* (2013.01); *H01L 2924/01033* (2013.01); *H01L 2924/01079* (2013.01); *H01L 2924/01082* (2013.01); *H01L 2924/12036* (2013.01); *H01L 2924/12042* (2013.01)

(58) Field of Classification Search
USPC ................ 257/99, E33.056, E33.058; 438/26
See application file for complete search history.

(56) References Cited

U.S. PATENT DOCUMENTS 5,986,324 A * 11/1999 Adlerstein et al. ............ 257/587
6,225,573 B1 * 5/2001 Nakamura ............. H05K 3/305
174/261
(Continued)

FOREIGN PATENT DOCUMENTS

| CN | 101053087 | 10/2007 |
|---|---|---|
| DE | 4228274 | 3/1994 |

(Continued)

*Primary Examiner* — Hrayr A Sayadian
(74) *Attorney, Agent, or Firm* — Cozen O'Connor

(57) ABSTRACT

An opto-electronic component has a carrier element (3) with a connection region (5). Arranged on the carrier element (3) is a semiconductor chip (7). A contact region (10) is mounted on the surface (8) of the semiconductor chip (7) remote from the carrier element (3). The connection region (5) is electrically conductively connected to the contact region (10) by way of an unsupported conductive structure (13). A method for manufacturing an opto-electronic component is described.

19 Claims, 11 Drawing Sheets

(51) Int. Cl.
*H01L 23/00* (2006.01)
*H01L 25/075* (2006.01)

(56) References Cited

U.S. PATENT DOCUMENTS

| | | | |
|---|---|---|---|
| 6,982,380 B2 * | 1/2006 | Hoffmann | H01L 24/31 174/520 |
| 2005/0225973 A1 | 10/2005 | Eliashevich et al. | |
| 2006/0006404 A1 | 1/2006 | Ibbetson et al. | |
| 2007/0145573 A1 * | 6/2007 | Otremba | H01L 23/49524 257/718 |
| 2008/0179603 A1 * | 7/2008 | Sakai et al. | 257/88 |
| 2008/0210954 A1 * | 9/2008 | Lee et al. | 257/88 |
| 2012/0322178 A1 | 12/2012 | Guenther et al. | |

FOREIGN PATENT DOCUMENTS

| | | |
|---|---|---|
| DE | 10 2004 050 177 | 4/2006 |
| DE | 10 2004 050 371 | 4/2006 |
| DE | 10 2007 030 129 | 1/2009 |
| EP | 1 553 641 | 7/2005 |
| EP | 2 081 238 | 7/2009 |
| JP | 11-191642 | 7/1999 |
| JP | 2000 101136 | 4/2000 |
| JP | 2004-006582 | 1/2004 |
| JP | 2008-505508 | 2/2008 |
| JP | 2008-103401 | 5/2008 |
| JP | 2008-515208 | 5/2008 |
| WO | WO 2006/034671 | 4/2006 |
| WO | WO 2006/078530 | 7/2006 |
| WO | WO 2007/018401 | 2/2007 |
| WO | WO 2008/056813 | 5/2008 |

* cited by examiner

OPTOELECTRONIC COMPONENT AND METHOD FOR PRODUCING AN OPTO-ELECTRONIC COMPONENT

RELATED APPLICATIONS

This is a U.S. national stage of application No. PCT/EP2010/064800, filed Oct. 5, 2010.

This application claims the priority of German application no. 10 2009 051 129.6 filed Oct. 28, 2009, the entire content of which is hereby incorporated by reference.

FIELD OF THE INVENTION

The present invention relates to an opto-electronic component having a carrier element which includes a connection region. A semiconductor chip is moreover mounted on the carrier element. Furthermore, a method for manufacturing an opto-electronic component is specified.

BACKGROUND OF THE INVENTION

An example of an opto-electronic component of this kind and the associated manufacturing method is known from the publication DE 10 2004 050 371 A1. According to this, a semiconductor chip is arranged on a carrier element and is provided for emitting electromagnetic radiation. The semiconductor chip has a contact region on its surface remote from the carrier element. Further, a connection region is provided on the carrier element. Mounted on the arrangement is a transparent, electrically insulating encapsulation film, made in particular of organic insulating materials. On this encapsulation film, an electrically conductive film is guided between the contact region on the semiconductor chip and the connection region of the carrier element. The semiconductor chip is supplied with current by way of this electrically conductive film.

In this arrangement, it is often problematic that the insulating film, which is penetrated by the electromagnetic radiation emitted by the semiconductor chip, has only a limited resistance to high temperature and limited stability to radiation. Moreover, the insulating film results in more than negligible stress on the electrical contacts as a result of the fact that the coefficients of thermal expansion of the insulating material and the contact material are different. There are also optical losses as a result of interference effects. Finally, organic insulating materials are expensive.

SUMMARY OF THE INVENTION

One object of the present invention is to provide an opto-electronic component by means of which the disadvantages described above are completely avoided or at least reduced.

Various embodiments of the opto-electronic component include an opto-electronic component having a carrier element. A semiconductor chip is arranged on the carrier element, and a connection region is provided. Mounted on the surface of the semiconductor chip remote from the carrier element is a contact region. The connection region on the carrier element is electrically conductively connected to the contact region of the semiconductor chip by way of an unsupported conductive structure.

The carrier element may be a lead frame, a ceramic, a printed circuit board (PCB), a metal-core board or an electrically conductive substrate.

The semiconductor chip may be a thin film chip having a thickness of approximately 10 µm, in the form purely of a surface emitter. As an alternative, the semiconductor chip may also be a volume emitter with a thickness in the order of magnitude of approximately 100 µm to 200 µm.

As the active zone, the semiconductor chip has a pn junction in which electromagnetic radiation is generated. The semiconductor chip is preferably made of a III-V compound semiconductor material, in particular a nitride compound semiconductor material.

The fact that the electrically conductive structure is unsupported—or to put it another way, is self-supporting—is particularly advantageous. This self-supporting structure makes it possible to dispense with an encapsulation or insulating film in the finished component. The electrically conductive structure is sufficiently stable in itself for there to be no need for a supporting encapsulation film underneath it. In other words, the conductive structure can bridge the spacing between the contact region of the semiconductor chip and the connection region of the carrier element without contact. As a result of the property of the conductive structure of being unsupported, an insulating film for electrically screening the conductive structure can be dispensed with. In particular, there is no encapsulation or insulating film on the surface and side faces of the semiconductor chip. This produces, among other things, the following advantages: the electromagnetic radiation generated in the active zone can leave the opto-electronic component without having to penetrate any kind of material, in particular silicone. Absorption of the electromagnetic radiation by molecules in the ambient air is negligibly small. This makes it possible for the component to have a high stability to radiation. Nor are there any interference effects which would result in optical losses. Further, the stress on the contacts is drastically reduced compared with arrangements in which the insulating film, usually made of silicone, remains on the semiconductor chip after contact is made. Silicone contracts and expands to a pronounced degree in the event of changes in temperature. In the case of temperatures above 150° C., which occur for example in car headlamps, the silicone becomes brittle and glassy and cracks are formed. This impairs the output of light and allows moisture to penetrate. The component according to the present invention accordingly has high stability in relation to heat. Finally, costs are lower because instead of a high-cost insulating film a cheaper masking substance can be used.

In a preferred embodiment of the opto-electronic component, a foot portion of the conductive structure, remote from the semiconductor chip, extends spatially over the connection region of the carrier element. It is particularly advantageous if the area of the connection region which is covered by the foot portion is as large as possible in order to generate as little electrical resistance as possible. This allows large currents to be transported. The mechanical stability of the connection between the foot portion and the connection region also increases as the area of the connection region which is covered by the foot portion increases. Preferably, the foot portion has an area in the order of magnitude of approximately 100 µm by approximately 100 µm. As a result of a sputtering process, sufficient adhesive force is achieved between the foot portion and the connection region. The adhesive force is imparted without additional adhesives and is based on a metal-to-metal bond.

In a preferred embodiment of the opto-electronic component, a head portion of the conductive structure, facing the semiconductor chip, extends spatially over the contact region (bond pad) of the semiconductor chip. Particularly advantageously, the size of the head portion corresponds to the size of the contact region. Preferably, the contact region may extend over the entire extent of the semiconductor chip in the transverse direction. This on the one hand allows large currents to be transported. On the other hand, this homogeneous supply of current results in a high injection rate of charge carriers in the active zone of the semiconductor chip and hence in a high light output. To minimise the shadowing of the emitted electromagnetic radiation by the contact region, the extent of the contact region in the longitudinal direction can be minimised. In other words, this results in a particularly narrow bond pad. Preferably, bond pads with an extent of approximately 50 µm in the longitudinal direction are used. Shorter lengths are also advantageous, a lower limit being determined by the transverse conductivity required.

In a further preferred embodiment, the spacing in a longitudinal direction between the foot portion and the head portion is at most approximately five times the thickness of the semiconductor chip. Typical thicknesses of the semiconductor chips used are up to approximately 200 µm. It is particularly advantageous to bridge a spacing of approximately three times the thickness of the semiconductor chip, or approximately 600 µm.

In a further preferred embodiment, the conductive structure has a curved shape between its foot portion and its head portion. An S shape is particularly advantageous. The curved shape has the result that the conductive structure can better tolerate expansions or contractions in the materials of the component in the event of changes in temperature. The flexibility of the curved conductive structure is greater than that of a completely straight conductive structure.

In a further embodiment, the conductive structure includes a metal or a metal alloy. Here, the high electrical conductivity and good mechanical stability of metals or metal alloys are advantageous. The conductive structure may also include an electrically conductive adhesive or a metal paste.

In a further embodiment, the conductive structure has an approximately homogeneous conductive structure thickness over its entire extent. This is particularly advantageous, since it results in an approximately uniform electrical resistance. It also improves the stability of the conductive structure. Conductive structure thicknesses of approximately 5 µm to approximately 60 µm are advantageous. Conductive structure thicknesses of approximately 15 µm to approximately 25 µm are particularly advantageous.

In a further embodiment, the conductive structure has an approximately homogeneous conductive structure width over its entire extent. This is particularly advantageous, since it results in an approximately uniform electrical resistance. It also improves the stability of the conductive structure. Conductive structure widths of approximately 20 µm to the entire extent of the semiconductor chip in the transverse direction, or in other words up to the entire width of the semiconductor chip, are advantageous. With a width of a semiconductor chip of approximately 2000 µm, which is typical with current technology, the maximum conductive structure width is thus approximately 2000 µm. Conductive structure widths of approximately 50 µm to approximately 150 µm are advantageous. With conventional wire bonding, depending on the material used bonding wires having a diameter between approximately 25 µm and approximately 50 µm are used. By using conductive structures having conductive structure widths greater than 50 µm, the current carrying capacity and the mechanical stability are improved by comparison with conventional wire bonding.

In a further embodiment, the carrier element has a connection film which makes the connection between the semiconductor chip and the carrier element. This connection film may be made of metal or a metal alloy or another electrically conductive material. In particular, an electrically conductive adhesive, a solder compound or a single-metal system may be used to secure the semiconductor chip to the carrier element. As a single-metal system, gold to gold connected by ultrasonic welding is preferably suitable. The connection film is set up to ensure not only mechanical and electrical contact but also thermal contact between the semiconductor chip and the carrier.

In a further embodiment, a contact face is provided between the connection film and the semiconductor chip. Combining the connection film and the contact face is particularly advantageous. This combination improves the mechanical, thermal and electrical connection between the semiconductor chip and the carrier.

In a further embodiment, the contact film may be electrically insulated from the carrier element and, by means of a conductive structure, be electrically connected to a contact region of a further semiconductor chip.

In a further embodiment, the surface of the semiconductor chip includes a second contact region. The second contact region is electrically connected, by means of a second conductive structure, to a contact region of a further semiconductor chip or a connection region. This is particularly advantageous, since it becomes possible for current to pass through a plurality of semiconductor chips, and operation of the opto-electronic component at high voltages is possible. It may also result in semiconductor light sources which can be operated at conventional mains voltages without major electrical losses. This enables a substantial contribution to be made to reducing costs, in particular for applications in the general lighting sector.

It is further advantageous that, in contrast to the wire bonding technique, the semiconductor chips may be positioned at a spacing of 50 µm from one another. This makes very short unsupported conductive structures possible. The space-saving arrangement of semiconductor chips results in a saving on material, in particular for the carrier element, which is frequently expensive.

Various embodiments of the method for manufacturing an opto-electronic component having a carrier element including a connection region, having a semiconductor chip which is mounted on the carrier element and having a contact region which is mounted on the surface of the semiconductor chip remote from the carrier element include the following method steps: first a masking substance is applied to the opto-electronic component. Then the masking substance is removed at least partly above the contact region (bond pad) and the connection region. Thereafter, a conductive structure is mounted between the contact region and the connection region. Here, the conductive structure extends over the masking substance. In a final step, the masking substance is, as far as possible, completely removed. This makes the conductive structure unsupported between the contact region and the connection region. In particular, the surface and the side faces of the semiconductor chip, at which the electromagnetic radiation can emerge, are in this context freed from the masking substance to the greatest possible extent.

The masking substance, which preferably takes the form of a film, may be applied by a plurality of different methods. Among others, vacuum lamination, dispensing, jetting, spraying on, stencil printing, moulding processes and spin coating are possible. The masking substance is formed at least form-fittingly onto the carrier element and the semiconductor chip such that there is no gap or interruption between the masking film and the regions covered by the masking film.

The use of a temporary masking substance instead of silicone insulating materials is particularly advantageous since, in contrast to silicone insulating films which have to remain on the component permanently, the demands made of the masking substances are low. For example, silicones must be transparent in the visible range, stable to UV and stable in relation to heat.

In contrast to insulating materials which are not temporary, it is possible to use a range of substances as the masking substances. Possibilities are, among others, photoresist, dry resist film, epoxy, polyimide, acrylates, wax, non-stick films, pastes and gels. All these substances are cheaper than silicone and moreover have advantages over silicone in respect of processing. For example, silicone tends to spread in the liquid state and has poor adhesion in the cured state.

Preferably, the masking substance above the contact region and the connection region is removed by means of laser ablation. The minimum achievable extent of exposed region is limited by the minimum achievable area of the laser spot, and is approximately 50 µm. If dry resist film or photoresist is used as the masking substance, it is particularly advantageous—because it is simple and cheap—to remove the masking substance above the contact region and the connection region by exposure to light and developing. The more expensive laser ablation is dispensed with.

In a further embodiment of the method according to the invention, the conductive structure is applied to the masking substance by applying a metallised layer flat. Flat conductive structures are particularly advantageous since by comparison with the bonding wires in conventional wire bonding they have a much higher current carrying capacity. It is also possible in this way to reduce the overall height of the opto-electronic component by comparison with conventional wire bonding.

The metallised layer may be applied flat to the masking substance and to at least part regions of the connection region and to at least part regions of the contact region in a textured manner. Among others, the following methods may alternatively be used:

Screen printing, in which stencils or masking covers are used to apply a metallised layer flat to the masking substance. In this context, metallised layer thicknesses of approximately 30 µm may be achieved in one process step. Preferably, for greater current carrying capacity and greater stability of the metallised layer structure, the process step may be repeated multiple times.

Dispensing, in which metal particles and an organic medium are blended to form a paste, and this paste is applied to the masking substance by means of a cannula and a syringe using pulses of compressed air. Then the paste is dried and tempered. It is particularly advantageous here that any shape of metallised layer may be achieved by way of the parameters of pressure and time. Dispensing produces a very durable metallised layer. Thicknesses of approximately 50 µm in the metallised layer can be produced.

Jetting, in which droplets of electrically conductive material from a reservoir are applied to the masking substance by means of short pulses. This method is particularly advantageous because it is performed without contact.

Spraying electrically conductive material.

In a further embodiment, the flat metallised layer is applied as a so-called seed layer, preferably by sputtering. Preferably, seed layer thicknesses of approximately 2 µm to 3 µm are achieved here. As the material for the seed layer, a compound of titanium and copper is preferably used. The titanium and copper are preferably sputtered on in one step, with the titanium serving as the adhesion promoter. The flat metallised layer is textured such that the conductive structure remains on the masking substance. This subsequent texturing of the metallised layer includes the following method steps:

photolithographing;

For three-dimensional structures such as those in the present invention, a dry resist film is preferably used, and this is laminated onto the three-dimensional topography of the opto-electronic component. Unlike a photoresist, the dry resist film is better at covering edges, with a more uniform thickness over the edges. Photoresist flows away over the edges of the semiconductor chip once it has been applied flat to the sputtered-on seed layer by spin coating and before the photoresist can solidify. Photoresist is highly suitable for two-dimensional structures, but these are not the subject of the present invention. Then the seed layer is exposed to light through a photomask. This is followed by developing the latent image, with removal of the exposed regions of the photoresist. Alternatively, the method step of photolithography may also be performed such that the exposed regions of the photoresist remain in place after developing.

galvanic reinforcement or electroplating of the photolithographed seed layer. During this, metal is precipitated onto the seed layer in a continuous electrochemical deposition. This method step is necessary, since the thinness of the seed layer makes its current carrying capacity too small. Here, the metal material is deposited in the regions from which the photoresist has been removed during developing. During electroplating, thicknesses of the metallised layer of up to approximately 50 µm can be achieved. Thicknesses between 15 µm and 30 µm are particularly advantageous. As the metallised layer material, copper is preferably used.

removal of the dry resist film;

removal, by etching, of the seed layer where it is not covered by the galvanic reinforcement. This step prevents short circuiting.

In a final method step, the masking substance is removed. There are various suitable methods. Which method is to be applied depends substantially on the masking substance used.

When photoresist or dry resist film is used as the masking substance, the masking substance is removed by stripping. This is carried out in a so-called stripper.

When resists are used as the masking substance, the masking substance may be removed by plasma ashing. Preferably, oxygen plasma is used for this. The resist is burned off by the plasma ashing. This is carried out in a so-called asher.

When for example epoxy or acrylates are used as the masking substance, the masking substance is removed by etching. Acetone is used among other things for the etching agent or etching medium.

A very low-cost electrical connection technique may be implemented for a multiple-chip arrangement. The cost advantage over conventional wire bonding results from the fact that, regardless of the number of electrical connections to be made, only the same process sequence is ever applied. For this reason, the method according to the invention can be used particularly advantageously if a plurality of semiconductor chips is to be electrically connected. The technological complexity always remains the same, regardless of whether an opto-electronic component having only one semiconductor chip or a large number of semiconductor chips is to be provided with electrical connections.

When connections are made between a plurality of semiconductor chips, the method according to the invention results in mechanically very stable conductive structures which are produced at the same quality. Reliability in operation of a multiple-connection technique of this kind is thus considerably improved by comparison with an individual connection technique. This advantage applies all the more the more electrical connections are to be made in the component.

BRIEF DESCRIPTION OF THE DRAWINGS

Various exemplary embodiments of the solution according to the invention will be explained in more detail below with the aid of the drawings.

Figure 1:
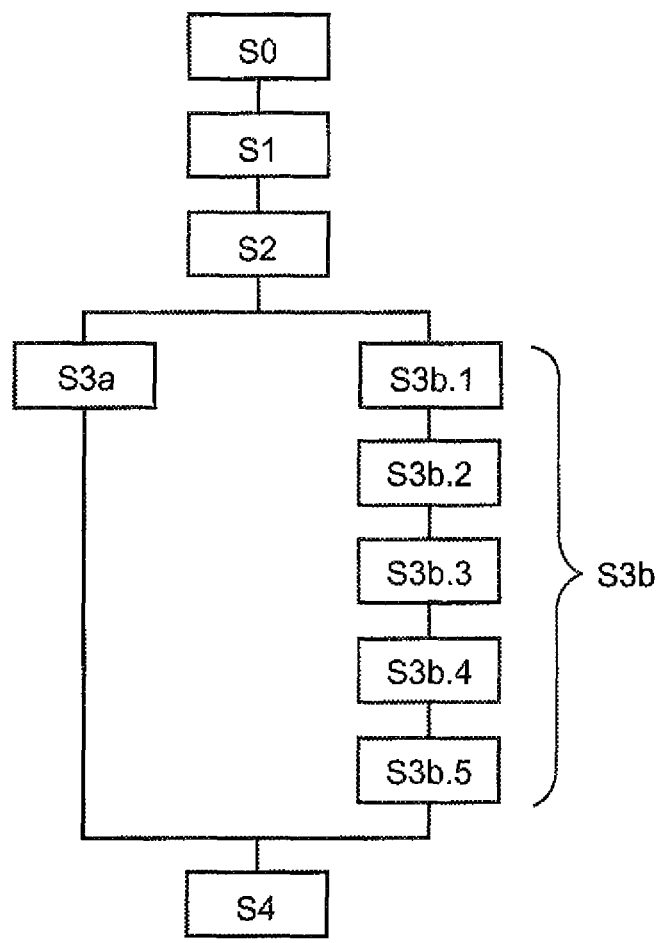
FIG. 1 shows a flow diagram of a method for manufacturing the opto-electronic component according to an embodiment of the invention.

For the sake of better orientation, a coordinate system is indicated in all the figures, the longitudinal direction being designated X, the transverse direction being designated Y and the direction vertical to X and Y being designated Z.

DETAILED DESCRIPTION OF THE DRAWINGS

Like, similar and equivalent elements are provided with the same reference numerals in the figures. The figures and the relative sizes of the elements illustrated in the figures should not be regarded as being to scale. Rather, individual elements may be illustrated on an exaggeratedly large scale for the sake of better illustration and better understanding.

FIG. 1 shows a flow diagram for manufacturing an opto-electronic component. The manufacturing process can be subdivided into steps S0 to S4.

Figure 2A:
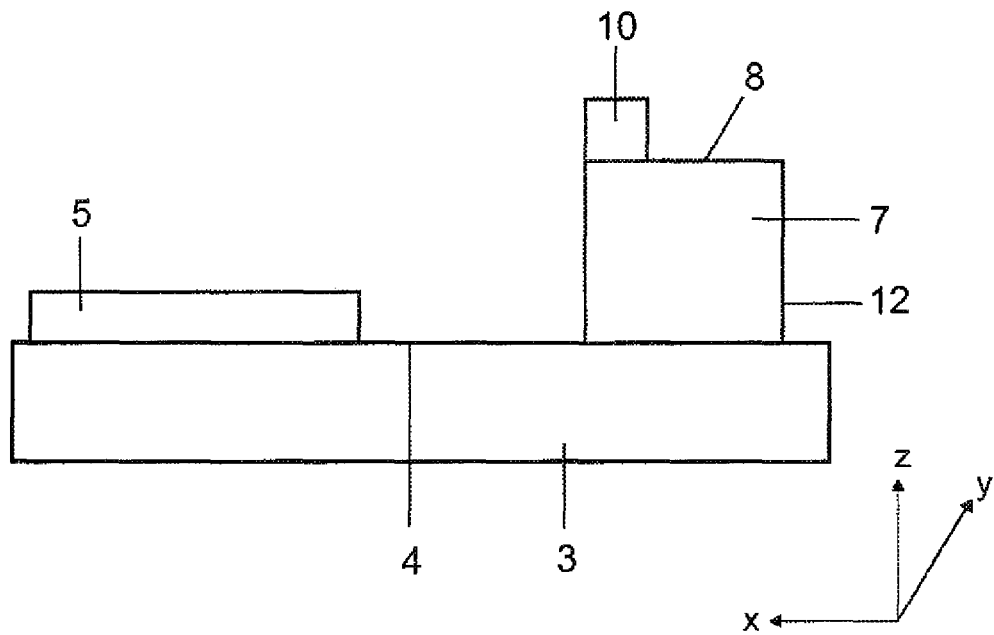
FIGS. 2a to 2d show the intermediate products of the manufacturing method from FIG. 1, in a schematic sectional view in the x-z plane.

In step S0, a carrier element 3 having a connection region 5 and a semiconductor chip 7 which is arranged on the carrier element 3 is prepared. The semiconductor chip 7 has a semiconductor chip thickness 12 of between approximately 10 μm and approximately 200 μm. The semiconductor chip 7 may be secured, for example using so-called vias, directly to the carrier element 3. This securing by vias is not illustrated in the figures. A contact region 10 is mounted on the surface 8 of the semiconductor chip 7 remote from the carrier element 3. The associated intermediate product is illustrated in FIG. 2a. A schematic sectional view is shown in the X-Z plane. The surface 4 of the carrier element 3 is partly covered by the connection region 5 and the semiconductor chip 7. The connection region 5 and the semiconductor chip 7 are spatially separated from one another and electrically insulated from one another.

Figure 2B:
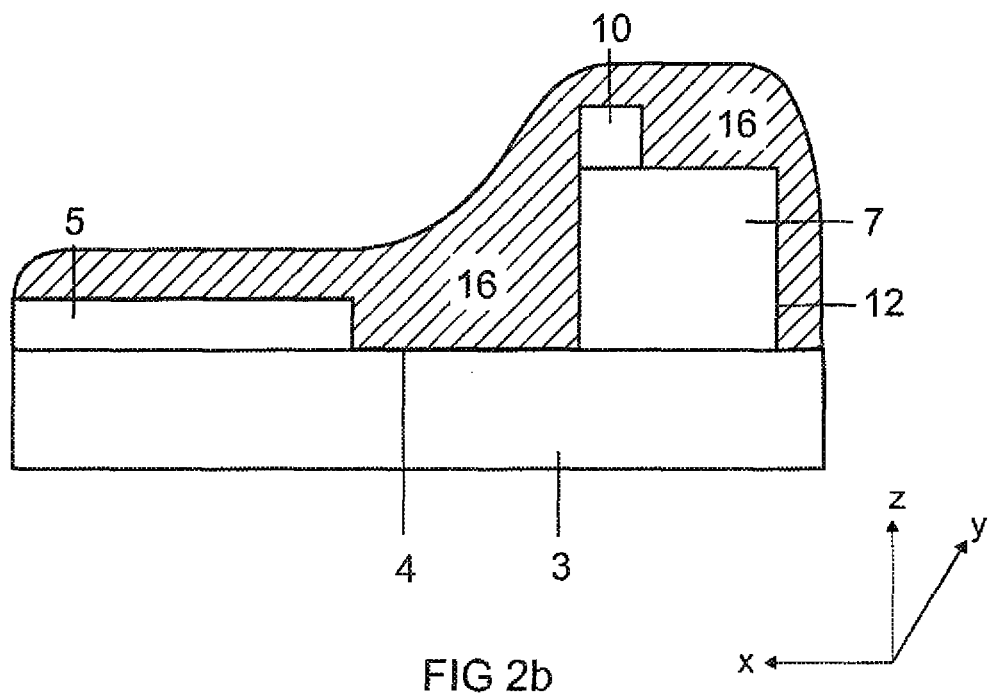

In step S1, a masking substance 16 is applied to the intermediate product prepared in step S0. As the masking substance, a dry resist film may be laminated on, or a photoresist may be applied by spin coating. The result of this method step is illustrated in FIG. 2b. This shows a schematic sectional view in the X-Z plane. The masking substance covers the entire surface of the intermediate product illustrated in FIG. 2a. The connection region 5, the semiconductor chip 7, the contact region 10 and the surface 4 of the carrier element 3 are covered with the masking substance. The masking substance 16 takes the form of a masking film in the present case. In the case of three-dimensional structures, a dry resist film is particularly advantageous, since the shape of the dry resist film can be controlled particularly well and simply by the lamination pressure.

Figure 2C:
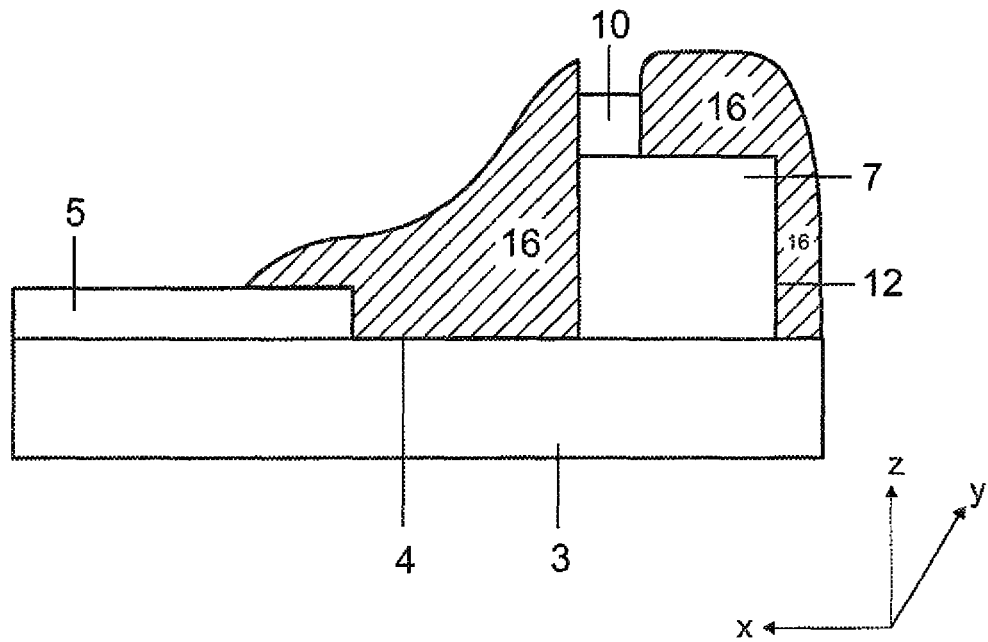

In step S2, the masking substance 16 is at least partly removed above the contact region 10 and the connection region 5. After this, at least a portion of the contact region 10 and a portion of the connection region 5 are completely freed of masking substance. If dry resist film or photoresist is used as the masking substance, partial removal of the masking substance may be performed by exposure to light and developing. For other masking substances, laser ablation may be used. The result of method step S2 is illustrated in FIG. 2c. This shows a schematic sectional view in the X-Z plane. The masking substance 16 is completely removed above the entire contact region 10. Some masking substance 16 still remains above the end of the connection region 5 facing the semiconductor chip 7.

In step S3, a conductive structure 13 is applied to the masking substance 16, between the contact region 10 and the connection region 5. In this case, the conductive structure 13 is applied flat to the masking substance 16.

In FIG. 1, two alternative routes for performing method step S3 are shown, resulting in the same end product, shown in FIGS. 2e, 3, 4, 5, 6 and 7.

The first alternative includes only a single method step (FIG. 1: S3a). Here, the metal conductive structure is applied in flat form in a single step to regions of the masking substance 16, and at least to regions of the connection film 5 and the contact region 10. This may be done by screen printing or jetting or dispensing or spraying. To obtain relative large conductive structure thicknesses 14, the same method step may be performed two or more times in succession.

The second alternative (FIG. 1: S3b) includes a plurality of part steps (FIG. 1: S3b.1 to S3b.5). In part step S3b.1, a metallised layer is applied flat. The metallised layer then covers the masking substance and at least parts of the connection region 5 and the contact region 10. The metallised layer may be applied in the form of a seed layer, by sputtering. In part step S3b.2, photolithography is used. Exposure to light using a photomask and developing the image produced creates a textured layer on the seed layer. This textured layer covers parts of the masking substance 16 and at least a region of the connection region 5 and at least a region of the contact region 10. The textured layer is continuous. This textured layer is galvanically reinforced in part step S3b.3. The part step of galvanic reinforcement may be repeated multiple times to increase the thickness of the metallised layer, usually made of copper. In other words, in the second alternative the process of adding the metallised layer is in two steps (S3b.1 and S3b.3) with an intermediate photolithographic step (S3b.2). In the subsequent part step S3b.4 the dry resist film is removed. The region of the seed layer that is not covered by the galvanically reinforced textured layer is removed completely by etching in part step S3b.5.

Figure 2D:
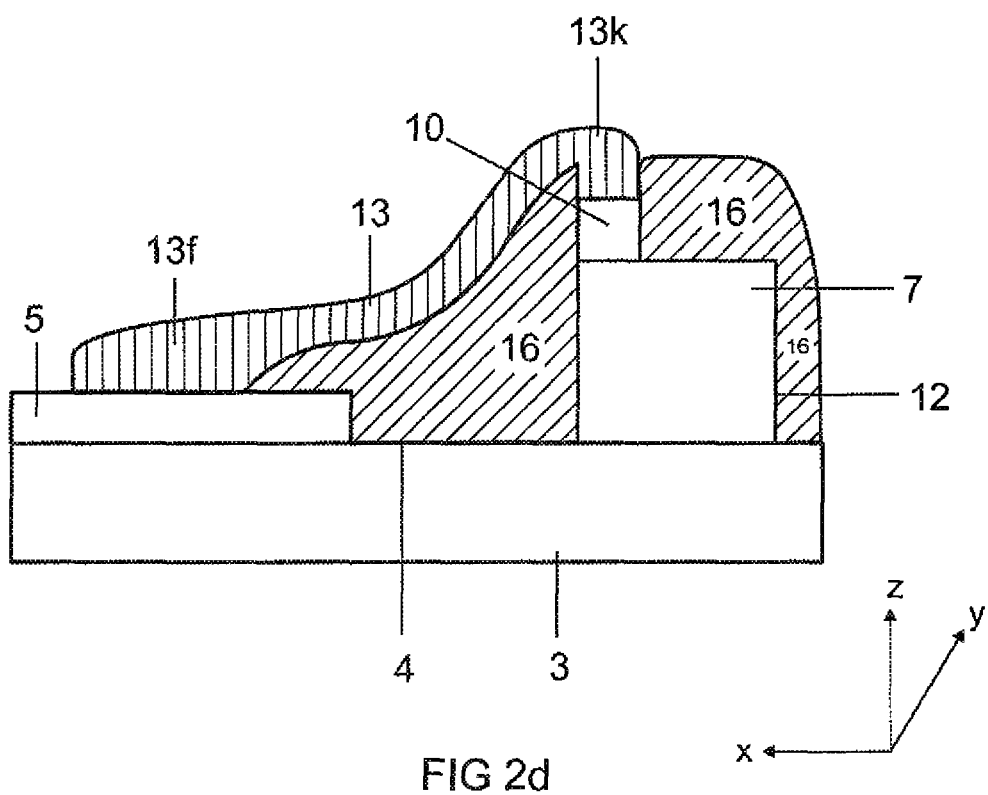

The result of method step S3—that is, regardless of whether this step is performed by alternative S3a or alternative S3b—is illustrated in FIG. 2d. FIG. 2d shows, in a schematic sectional view, the conductive structure 13 mounted on the masking substance 16. The conductive structure is formed form-fittingly onto the masking film. The conductive structure 13 connects the connection region 5 and the contact region 10 of the semiconductor chip 7. The conductive structure 13 includes a head portion 13k and a foot portion 13f. The foot portion 13f is electrically conductively and mechanically connected to the connection region 5. The head portion 13k is electrically conductively and mechanically connected to the contact region 10. The conductive structure 13 has a curved shape in the X-Z plane between its foot portion 13f and its head portion 13k. The curved shape may be an S shape. This shape depends on the shape of the surface of the masking substance 16 between the contact region 10 and the connection region 5. The conductive structure 13 is a metal or a metal alloy.

In the final step S4, the masking substance 16 is completely removed. Depending on the masking substance 16 used, various methods are used to remove the masking substance 16. If photoresist or dry resist film is used as the masking substance 16, the masking substance may be removed by stripping. The masking substance may also be removed by plasma ashing. If epoxy or acrylates are used as the masking substance, the masking substance 16 may be removed by etching.

Figure 2E:
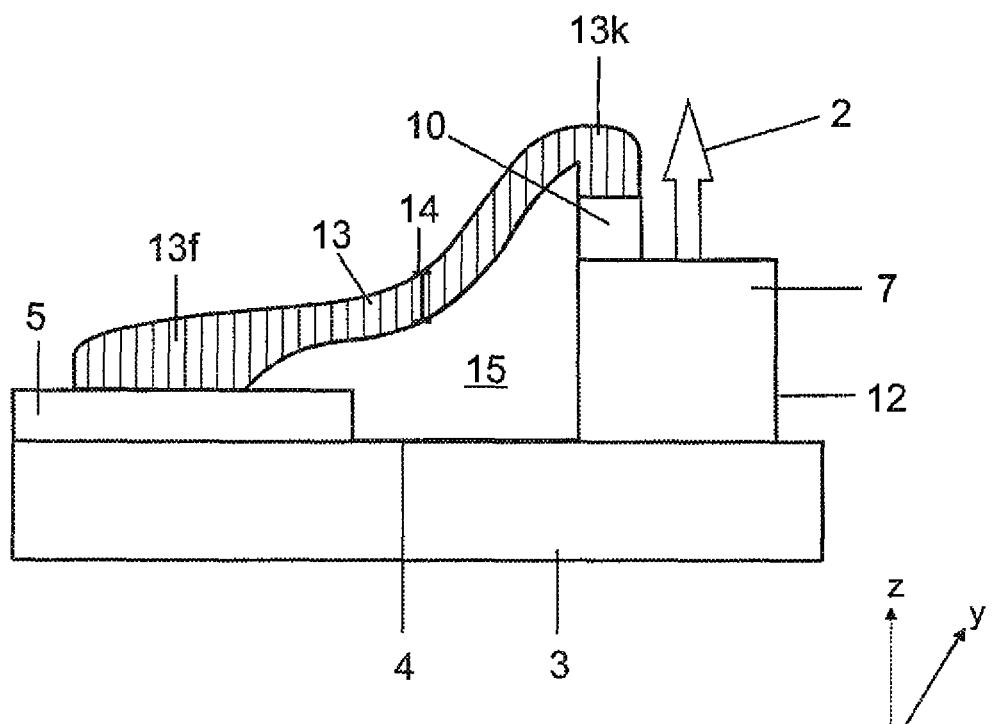
FIG. 2e shows an exemplary embodiment of the opto-electronic component as the end product of the manufacturing method from FIG. 1, in a schematic sectional view in the x-z plane.

The result of the method step S4 is illustrated in FIG. 2e. FIG. 2e illustrates the end product produced by the method performed in steps S0 to S4. FIG. 2e shows a schematic sectional view of the finished opto-electronic component 1. Elements which have already been described in the description of FIGS. 2a to 2d also apply to the exemplary embodiment illustrated in FIG. 2e. The conductive structure 13 is unsupported between the contact region 10 and the connection region 5. In FIG. 2e, the spacing in the longitudinal direction X between the foot portion 13f and the head portion 13k is approximately 2.5 times the thickness 12 of the semiconductor chip 7. In exemplary embodiments which are not shown, this spacing may be greater or less than 2.5 times the thickness 12 of the semiconductor chip 7. The spacing may be at most approximately five times the thickness 12 of the semiconductor chip 7. The conductive structure 13 has an approximately homogeneous conductive structure thickness 14 over its entire extent. The conductive structure thickness 14 may be between approximately 5 μm and approximately 60 μm. Particularly preferred are conductive structure thicknesses 14 in a range of approximately 15 μm to approximately 25 μm.

Figure 3:
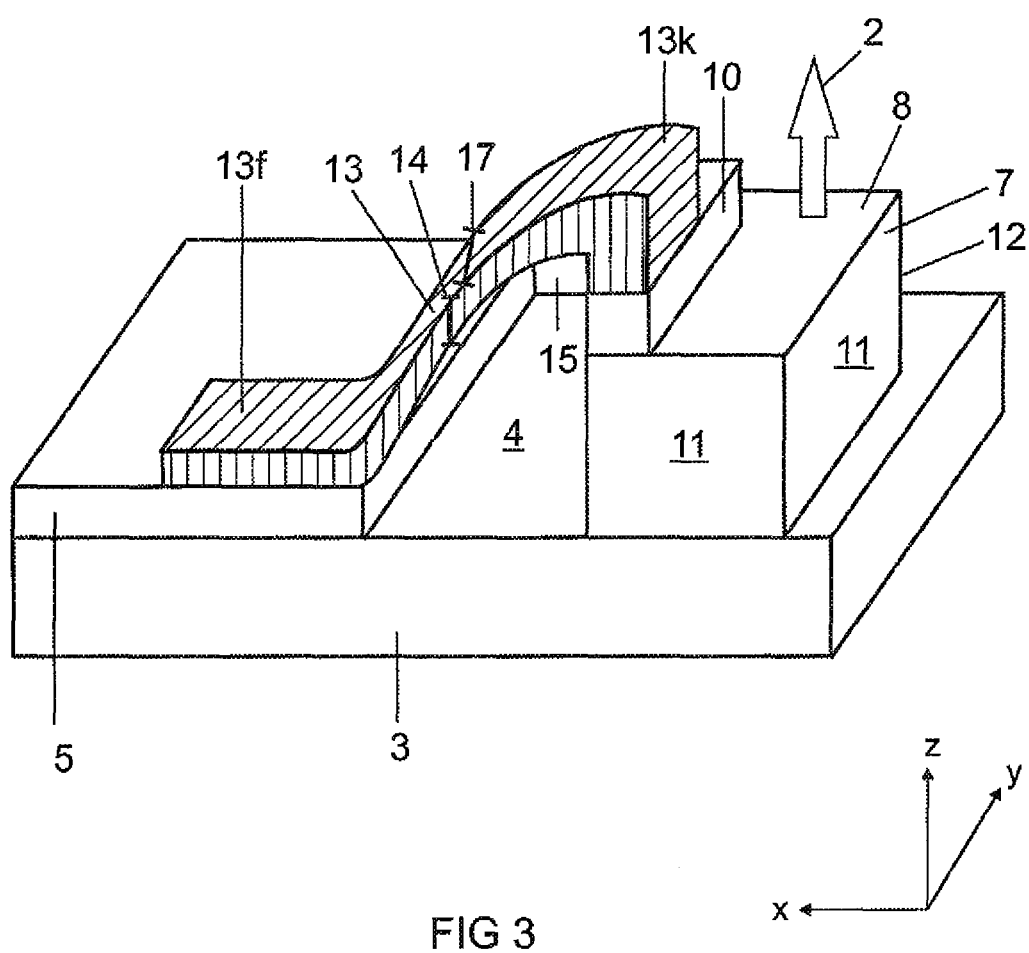
FIG. 3 shows an exemplary embodiment of the opto-electronic component, in a schematic three-dimensional view.

FIG. 3 shows a schematic three-dimensional view of the finished opto-electronic component 1. Elements which have already been described in the description of FIGS. 2a to 2e also apply to the exemplary embodiment illustrated in FIG. 3. The foot portion 13f of the conductive structure 13 which is remote from the semiconductor chip 7 extends spatially over the connection region 5. The foot portion 13f is flat in construction and extends in the longitudinal direction X and the transverse direction Y. In the present exemplary embodiment, the foot portion 13f covers only part of the connection region 5. The head portion 13k of the conductive structure 13 extends spatially over the contact region 10 of the semiconductor chip 7. The head portion 13k extends in the longitudinal direction X and the transverse direction Y. To keep the shadowing of electromagnetic radiation 2 emitted by the semiconductor chip 7 small, the contact region 10 extends approximately 50 μm in the longitudinal direction. Smaller extents are also advantageous. In the present exemplary embodiment, the head portion 13k covers only part of the contact region 10. Between the surface 4 of the carrier element 3 and the flat conductive structure 13 a region 15 of space is formed. The region 15 of space is completely freed of the masking substance 16. The side faces 11 and surface 8 of the semiconductor chip 7 are also completely freed of the masking substance 16. The electromagnetic radiation 2 emitted by the semiconductor chip 7 need no longer pass through an insulating film. The conductive structure (13) has an approximately homogenous conductive structure width (17) over its entire extent. Preferred are conductive structure widths (17) of approximately 20 μm to approximately 200 μm. Particularly preferred are conductive structure widths (17) of between 50 μm and 150 μm.

Figure 4:
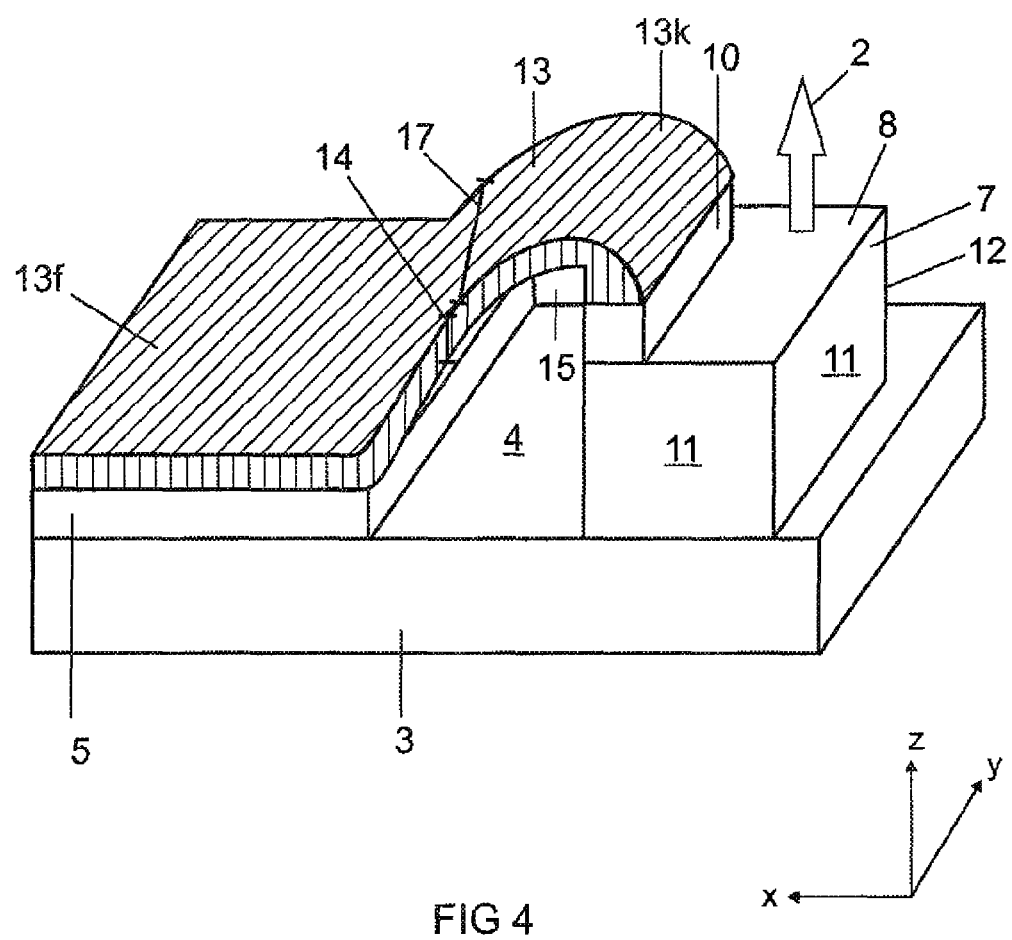
FIG. 4 shows a further exemplary embodiment of the opto-electronic component, in a schematic three-dimensional view.

FIG. 4 shows a further exemplary embodiment of the present invention in a three-dimensional view. Elements which have already been described in the description of FIGS. 2a to 2e and FIG. 3 also apply to the exemplary embodiment illustrated in FIG. 4. In contrast to the first exemplary embodiment, in FIG. 4 the foot portion 13f and the head portion 13k extend spatially to the maximum amount. The foot portion 13f covers the entire connection region 5, and the head portion 13k covers the entire contact region 10. It is particularly advantageous in the present exemplary embodiment that in the transverse direction Y the contact region 10 extends over the entire extent of the semiconductor chip in the transverse direction Y. This results in a greater current carrying capacity than in the first exemplary embodiment. The adhesive force which keeps the foot portion 13f on the connection region 5 and the head portion 13k on the contact region 10 is also greater than in the first exemplary embodiment. As a result of the (by comparison with the first exemplary embodiment) greater extent in the transverse direction Y of the conductive structure 13 in the unsupported region—that is to say between the foot portion 13f and the head portion 13k—the current carrying capacity and the mechanical stability of the conductive structure 13 are increased. In the present exemplary embodiment, the conductive structure width 17 is the entire extent of the semiconductor chip 7 in the transverse direction Y. With a typical width Y of the semiconductor chip 7 of 2000 μm, the conductive structure width 13 is thus 2000 μm.

Not illustrated in the figures are exemplary embodiments which, as regards the spatial extent of the foot region 13f on the connection region 5 and/or the head region 13k on the contact region 10 and/or the conductive structure width 17, lie, between the exemplary embodiments shown in FIG. 3 and FIG. 4.

Figure 5:
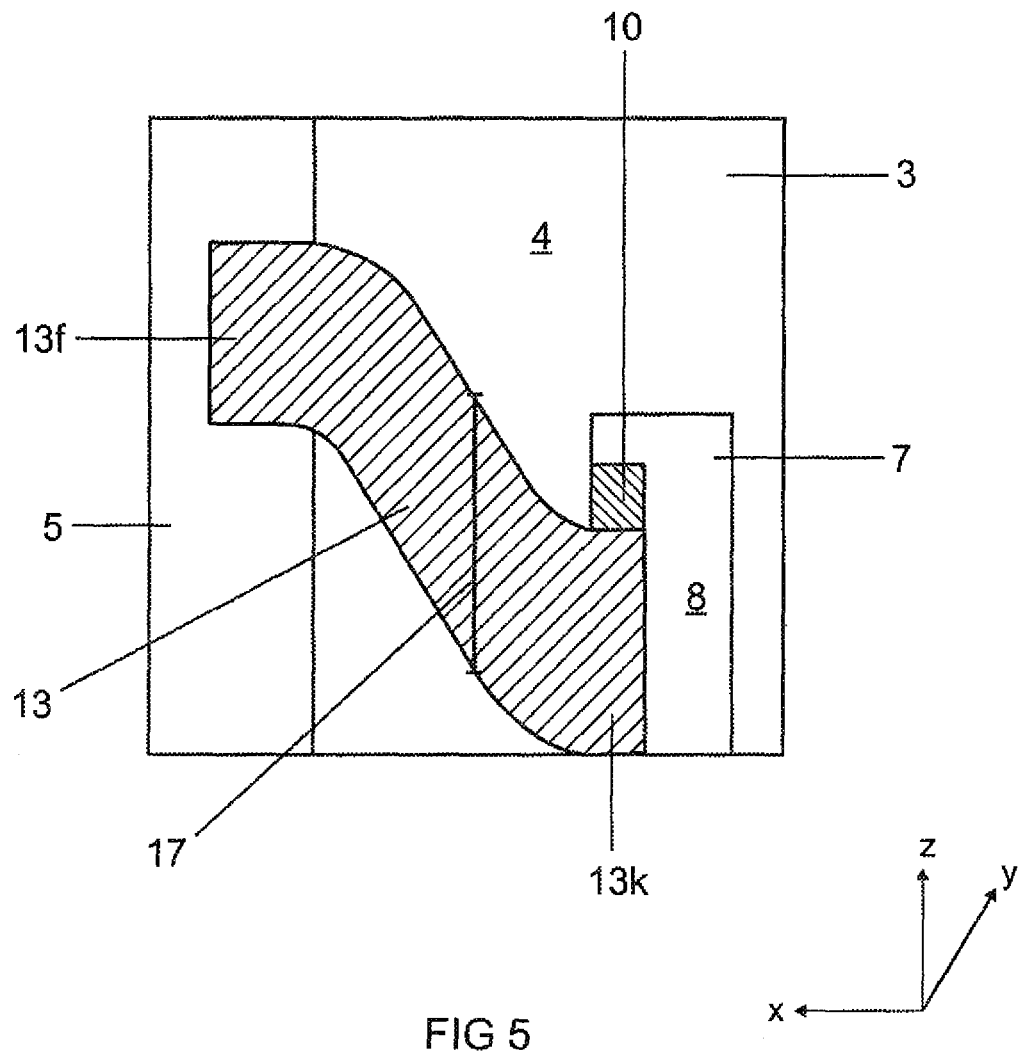
FIG. 5 shows a further exemplary embodiment of the opto-electronic component, in a schematic plan view of the x-y plane.

FIG. 5 shows a further exemplary embodiment of the present invention, in a schematic plan view of the X-Y plane. Elements which have already been described in the description of FIGS. 2a to 2e and FIGS. 3 and 4 also apply to the exemplary embodiment illustrated in FIG. 5. In FIG. 5, the conductive structure 13 is curved in the X-Y plane. A curve in an S shape is particularly advantageous. In other words, the foot portion 13f lies on the connection region 5 at a different position in the transverse direction Y from that of the head portion 13k on the contact region 10. The head portion 13k covers only part of the contact region 10. The S-shaped curve of the conductive structure 13 in the X-Y plane increases the stability of the conductive structure 13. In an exemplary embodiment which is not shown, the curves of the conductive structure 13 in the X-Z plane and the X-Y plane are combined.

Figure 6:
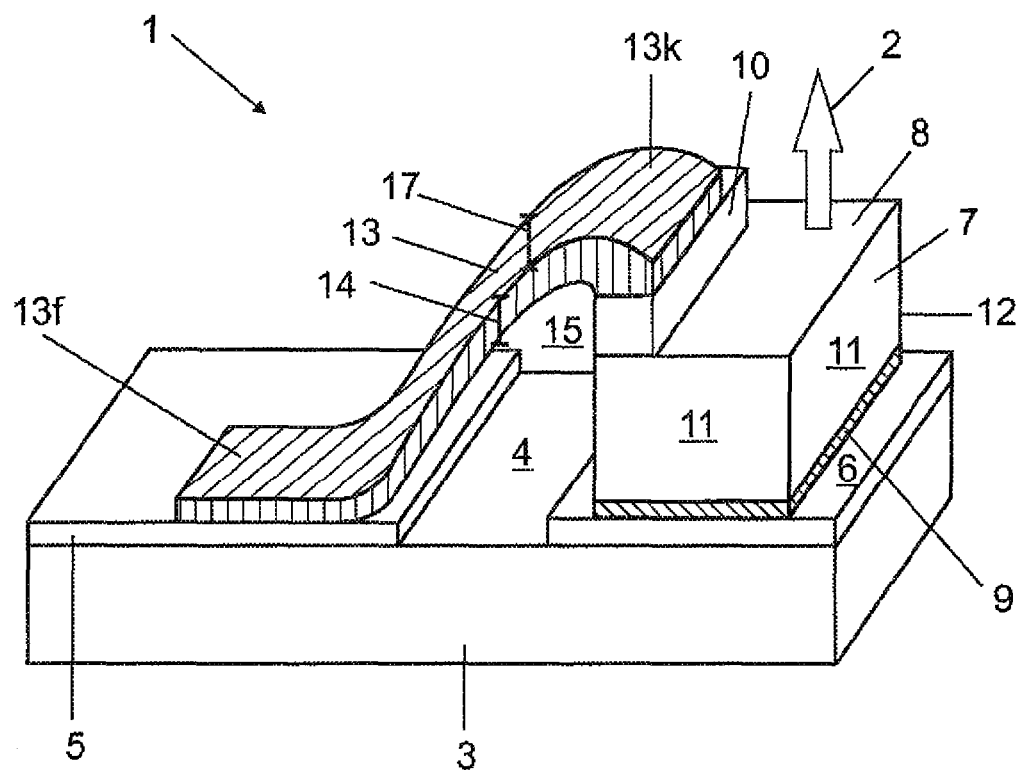
FIG. 6 shows a further exemplary embodiment of the opto-electronic component, in a schematic three-dimensional view.

FIG. 6 shows a further exemplary embodiment of the present invention, in a schematic three-dimensional view. Elements which have already been described in the description of FIGS. 2a to 2e and FIGS. 3 to 5 also apply to the exemplary embodiment illustrated in FIG. 6. In contrast to the exemplary embodiments shown in FIGS. 2e, 3 and 4, the carrier element 3 includes, in addition to the connection region 5, a connection film 6. Moreover, a contact face 9 of the semiconductor chip 7 is provided between the connection film 6 and the semiconductor chip 7. The connection film 6 is connected to the contact face 9 by a solder connection or an electrically conductive adhesive. This makes a mechanical, electrical and thermal connection between the semiconductor chip 7 and the carrier element 3. In exemplary embodiments which are not shown, the connection between the semiconductor chip 7 and the carrier element 3 may alternatively be formed only by the connection film 6 or only by the contact face 9.

Figure 7:
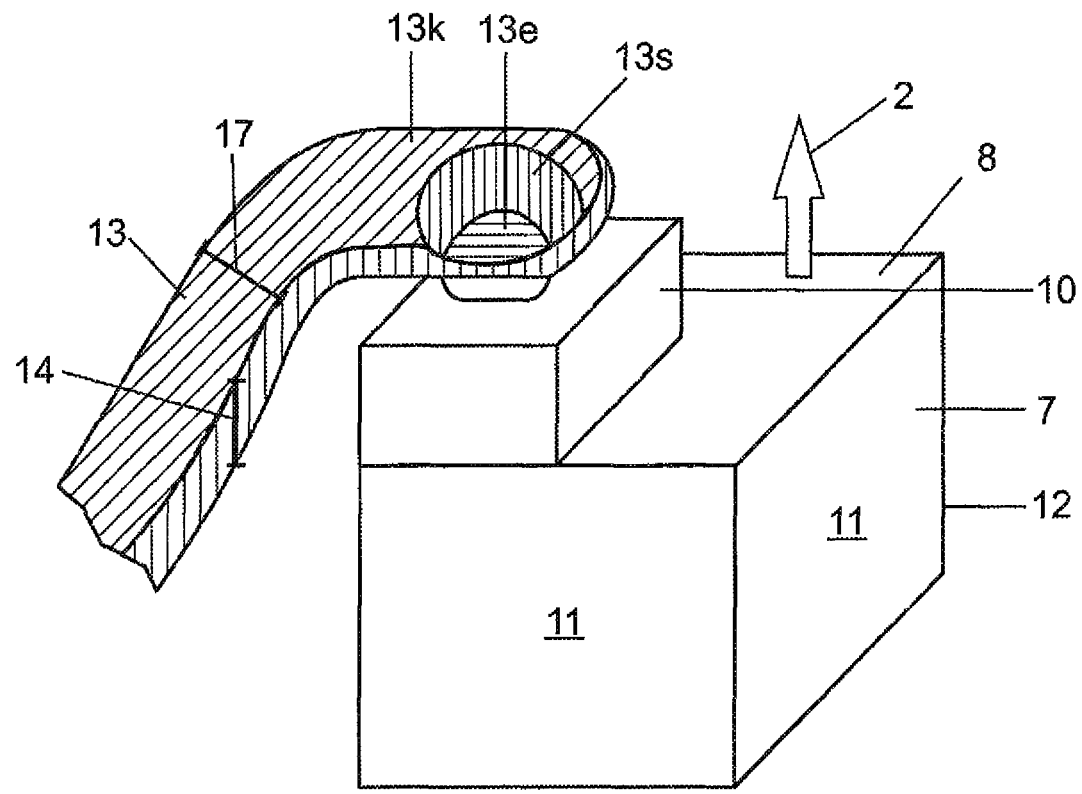
FIG. 7 shows a detail of an exemplary embodiment of the opto-electronic component, in a schematic three-dimensional view.

FIG. 7 shows a detail of an exemplary embodiment of the opto-electronic component in a diagrammatic three-dimensional view. Elements which have already been described in the description of FIGS. 2a to 2e and FIGS. 3 to 6 also apply to the detail of the exemplary embodiment illustrated in FIG. 7. FIG. 7 shows the semiconductor chip 7, with its contact region 10, and part of the conductive structure 13 with its head portion 13k. The head portion 13k includes a recess 13e. The shape of the recess is circular in the X-Y plane. The side wall 13s of the recess 13e is preferably inclined in relation to the surface 8 of the semiconductor chip 7 parallel to the X-Y plane. This incline is a function of the shape of the opening in the masking substance 16 above the contact region 10. The shape of the opening in the masking substance above the contact region 10 may be controlled and affected by the laser ablation method. As a result of the incline in the side wall 13s, during the metallisation process a homogeneous metallised layer of uniform thickness is produced over the side wall 13s. This is favourable as regards current carrying capacity. In exemplary embodiments which are not shown, the recess 13e has an elliptical, oval or elongate shape. In the exemplary embodiment shown in FIG. 4, the head portion 13k extends over the entire width in the transverse direction Y of the contact region 10 and the semiconductor chip 7. In that case the recess 13e extends over the entire width of the head portion 13k. The shape of the recess 13e is then elongate.

Figure 8:
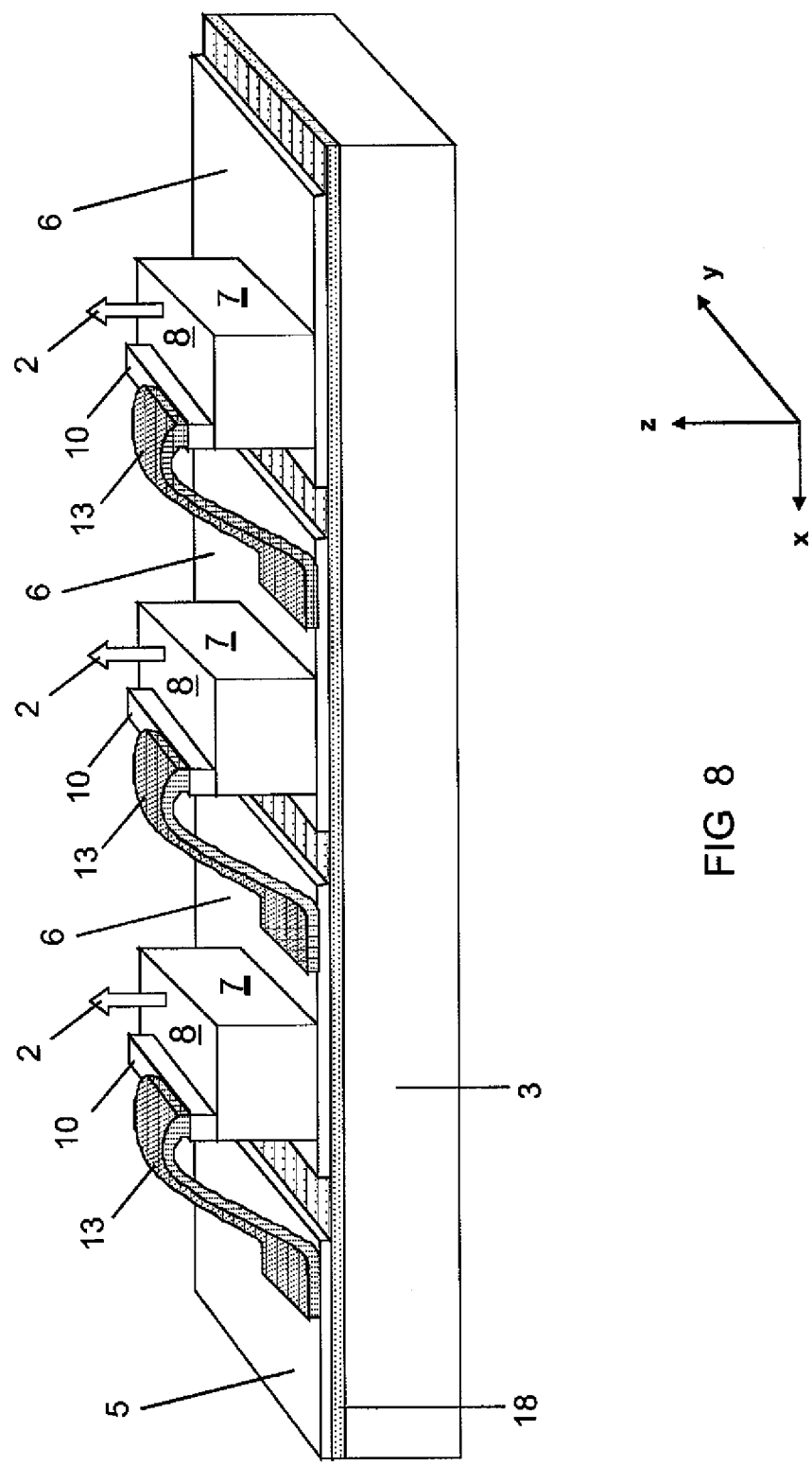
FIG. 8 shows a further exemplary embodiment of the opto-electronic component, in a schematic three-dimensional view.

FIG. 8 shows a further exemplary embodiment of the present invention in a schematic three-dimensional view. Elements which have already been described in the description of FIGS. 2a to 2e and FIGS. 3 to 7 also apply to the exemplary embodiment illustrated in FIG. 8. In contrast to the exemplary embodiments which are shown in FIGS. 2e, 3, 4 and 6, a plurality of semiconductor chips 7 are arranged on the carrier element 3. The semiconductor chips 7 in this exemplary embodiment carry current vertically. The semiconductor chips 7 are for example connected to a connection film 6 by a solder connection or an electrically conductive adhesive, as described in exemplary embodiment 6. The connection film 6 takes a form such that it also serves as a connection region for the conductive structure 13, in order to make an electrical connection with the successive semiconductor chip 7. Where an electrically conductive carrier element 3 is used, an electrically insulating intermediate film 18 is arranged between the carrier element 3 and the connection region 5 or connection film 6. This ensures that the connection region 5 and the respective connection films 6 are separated from one another spatially and electrically. The insulating intermediate film 18 may for example be made of $SiO_2$ or $SiN_4$ or polycrystalline silicon or a combination of these materials. Where an electrically insulating carrier element 3 is used, the insulating intermediate film 18 may be dispensed with. The arrangement illustrated in the exemplary embodiment makes it possible for current to pass through a plurality of semiconductor chips 7 in that an electrical voltage is applied between the connection region 5 and the connection film 6 of the semiconductor chip 7 arranged at the end of the row. The arrangement illustrated may be extended to include any number of semiconductor chips. This makes operation of the opto-electronic component at high voltages possible. The carrier element 3 may be dimensioned such that the semiconductor chips 7 are arranged either linearly in a row or in a serpentine shape or in any other shape. It is also possible for the illustrated series connections of the semiconductor chips to be operated with current carried through them in parallel.

Figure 9:
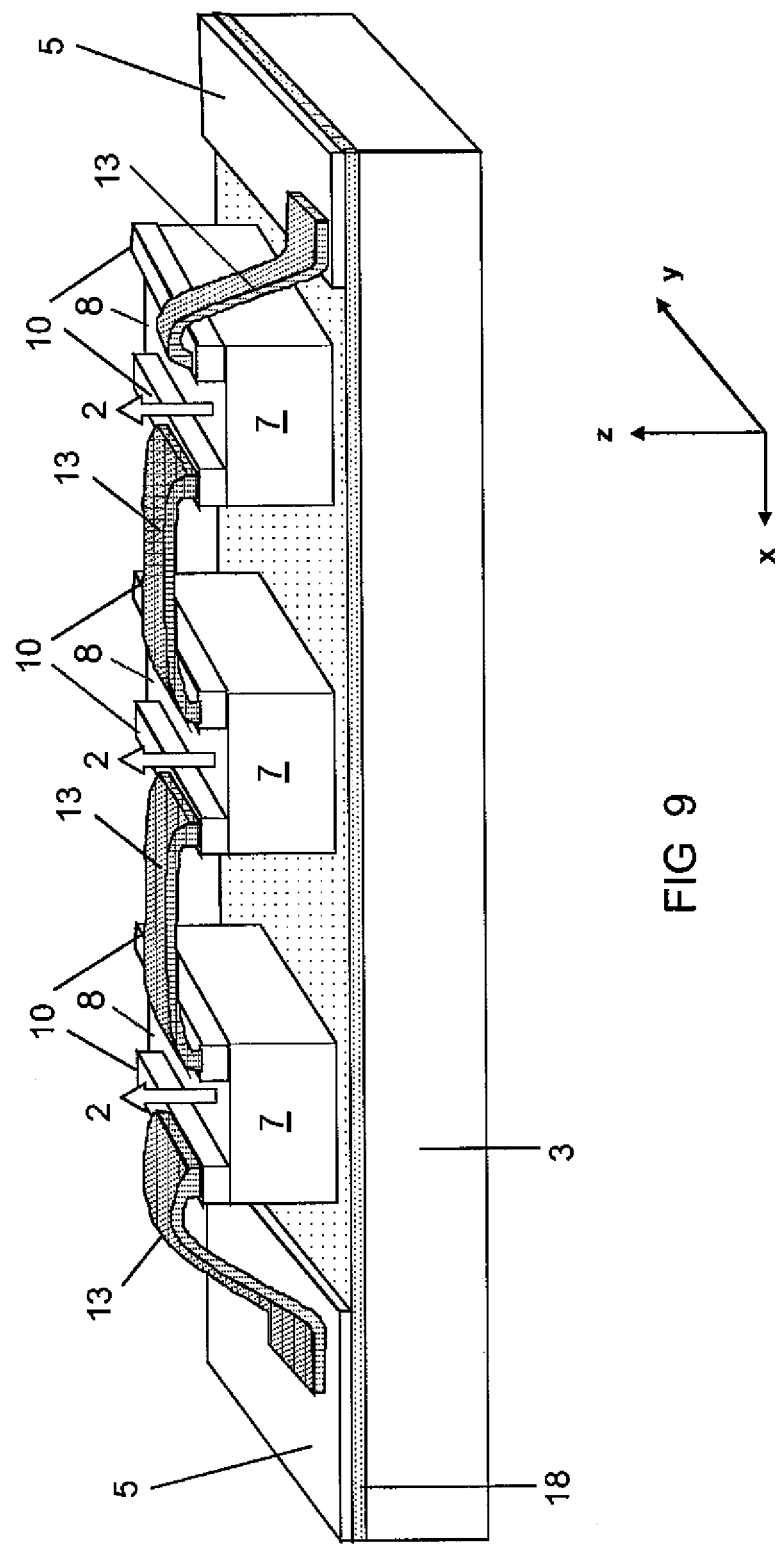
FIG. 9 shows a further exemplary embodiment of the opto-electronic component, in a schematic three-dimensional view.

FIG. 9 shows a further exemplary embodiment of the present invention in a diagrammatic three-dimensional view. Elements which have already been described in the description of FIGS. 2a to 2e and FIGS. 3 to 8 also apply to the exemplary embodiment illustrated in FIG. 9. In contrast to the exemplary embodiment 8, in the exemplary embodiment 9 semiconductor chips 7 which each have two contact regions 10 on their front side are used. Where an electrically conductive carrier element 3 and an electrically non-insulating rear side of the semiconductor chips 7 are used, the carrier element 3 is additionally provided with an electrically insulating intermediate film 18. Where an electrically insulating rear side of the semiconductor chips 7 or an electrically insulating carrier element 3 is used, the insulating intermediate film 18 may be dispensed with. The contact region 10 of a semiconductor chip 7 of defined polarity is electrically connected, via the conductive structure 13, to the contact region 10 of the successive semiconductor chip 7, which has the opposite polarity. The arrangement illustrated in the exemplary embodiment makes it possible for current to pass through the plurality of semiconductor chips 7 in that an electrical voltage is applied between the connection region 5 at the start of the row and the connection region 5 of the chip arranged at the end of the row. The arrangement illustrated may be extended to include any number of chips, as a result of which operation of the opto-electronic component at high voltages is possible. The carrier element 3 may be dimensioned such that the semiconductor chips 7 are arranged either linearly in a row or in a serpentine shape or in any other shape. It is also possible for the illustrated series connections of the semiconductor chips to be operated with current carried through them in parallel.

The opto-electronic semiconductor component and the method for manufacturing an opto-electronic semiconductor component have been described for the purpose of illustrating the underlying concept by way of some exemplary embodiments. The exemplary embodiments here are not restricted to certain combinations of features. Even if some features and embodiments have only been described in connection with a particular exemplary embodiment or individual exemplary embodiments, they may in each case be combined with other features from other exemplary embodiments. It is also conceivable for individual features that are illustrated or particular embodiments to be omitted or added to exemplary embodiments provided the general technical teaching is still implemented.

Even though the steps of the method for manufacturing an opto-electronic semiconductor component are described in a particular order, it goes without saying that each method described in this disclosure may be performed in any other sensible order, it also being possible to omit or add method steps, provided this does not depart from the basic concept of the technical teaching described.

The invention claimed is:

1. A method for manufacturing an opto-electronic component comprising:
a carrier element having a connection region;
a semiconductor chip which is arranged on the carrier element;
a contact region which is mounted on a surface of the semiconductor chip remote from the carrier element;
wherein the method comprises the steps of:
applying a masking substance to the opto-electronic component;
removing the masking substance above the contact region and the connection region;
mounting a conductive structure between the contact region and the connection region to electrically conductively connect the contact region to the connection region, the conductive structure having a foot portion and a head portion, wherein the foot portion is remote from the semiconductor chip and extends spatially over the connection region and/or wherein the head portion faces the semiconductor chip and extends spatially over the contact region, and wherein the conductive structure has an S-shape in a side and in a plan view, between the foot portion and the head portion in a side view and in a plan view; and
removing the masking substance such that the conductive structure is unsupported between the contact region and the connection region.

2. The method as claimed in claim 1, wherein the conductive structure is applied between the contact region and the connection region by applying a metallised layer flat.

3. The method according to claim 2, wherein the metallised layer is applied flat in a textured manner by one of
screen printing,
jetting, dispensing or
spraying, and
wherein the conductive structure is produced between the contact region and the connection region.

4. The method as claimed in claim 2, wherein the metallised layer that is applied flat is textured such that the conductive structure remains between the contact region and the connection region.

5. The method as claimed in claim 4, wherein texturing of the metallised layer includes the following method steps:
photolithographing using a dry resist film,
galvanic reinforcement,
removal of the dry resist film,
removal, by etching, of the seed layer.

6. The method as claimed in claim 1, wherein the masking substance includes at least one of the following materials:
photoresist,
dry resist film,
epoxy,
polyimide,
acrylates,
wax,
non-stick films,
pastes,
gels.

7. The method as claimed in claim 1, wherein the masking substance is applied to the opto-electronic component by one of the following methods:
vacuum lamination, dispensing,
jetting,
spraying on,
stencil printing,
moulding processes, or
spin coating.

8. The method as claimed in claim 1, wherein the masking substance is removed by one of the following methods:
stripping,
etching, or
plasma ashing.

9. An opto-electronic component comprising:
a carrier element having a connection region;
a semiconductor chip which is arranged on the carrier element; and
a contact region which is mounted on a surface of the semiconductor chip remote from the carrier element;
an unsupported conductive structure having a foot portion and a head portion, wherein:
the foot portion is remote from the semiconductor chip and extends spatially over the connection region; and/or
the head portion faces the semiconductor chip and extends spatially over the contact region;
wherein the connection region is electrically conductively connected to the contact region via the unsupported conductive structure, and
wherein the conductive structure has an S-shape in a side view and in a plan view, between the foot portion and the head portion.

10. The opto-electronic component as claimed in claim 9, wherein the conductive structure includes a metal or a metal alloy.

11. The opto-electronic component as claimed in claim 9, wherein the conductive structure has a homogeneous conductive structure thickness over its entire extent.

12. The opto-electronic component as claimed in claim 9, wherein the conductive structure has an approximately homogeneous conductive structure width over its entire extent, and wherein the conductive structure has a width of at least 20 µm up to the entire extent of the semiconductor chip in the transverse direction.

13. The opto-electronic component as claimed in claim 9, wherein a second contact region is arranged on the surface of the semiconductor chip and is electrically connected, by a second conductive structure, to a contact region of a further semiconductor chip or a connection region.

14. The opto-electronic device as claimed in claim 9, wherein the head portion includes a recess having a circular, elliptical, or oval, and/or elongate shape in the plan view.

15. The opto-electronic device as claimed in claim 14, wherein a side wall of the recess is inclined in relation to the surface of the semiconductor chip.

16. An opto-electronic component comprising:
a carrier element having a connection region;
a semiconductor chip arranged on the carrier element;
a contact region mounted on the surface of the semiconductor chip remote from the carrier element;
an unsupported conductive structure comprising a foot portion remote from the semiconductor chip and a head portion facing the semiconductor chip;
wherein the connection region is electrically conductively connected to the contact region via the conductive structure, and
the head portion defines a recess having a circular, elliptical, oval, and/or elongate shape in a plan view.

17. The opto-electronic device as claimed in claim 16, wherein a side wall of the recess is inclined in relation to the surface of the semiconductor chip.

18. The opto-electronic device as claimed in claim 16, wherein the recess is an indentation extending partially through the conductive structure in a vertical direction.

19. An opto-electronic component comprising:
a carrier element having a connection region;
a semiconductor chip arranged on the carrier element;
a contact region mounted on the surface of the semiconductor chip remote from the carrier element;
an unsupported conductive structure comprising a foot portion remote from the semiconductor chip and a head portion facing the semiconductor chip;
wherein the connection region is electrically conductively connected to the contact region via the conductive structure,
the head portion defining a recess having an elongated shape in a plan view, and
the head portion and the recess extend over a large part of the contact region.

* * * * *